(12) United States Patent
Beyer et al.

(10) Patent No.: US 7,799,682 B2
(45) Date of Patent: Sep. 21, 2010

(54) TRANSISTOR HAVING A LOCALLY PROVIDED METAL SILICIDE REGION IN CONTACT AREAS AND A METHOD OF FORMING THE TRANSISTOR

(75) Inventors: Sven Beyer, Dresden (DE); Patrick Press, Dresden (DE); Thomas Feudel, Radebeul (DE)

(73) Assignee: GlobalFoundries Inc., Grand Cayman (KY)

( * ) Notice: Subject to any disclaimer, the term of this patent is extended or adjusted under 35 U.S.C. 154(b) by 23 days.

(21) Appl. No.: 11/697,890

(22) Filed: Apr. 9, 2007

(65) Prior Publication Data

US 2008/0054371 A1 Mar. 6, 2008

(30) Foreign Application Priority Data

Aug. 31, 2006 (DE) ........................ 10 2006 040 764

(51) Int. Cl.
*H01L 29/78* (2006.01)
(52) U.S. Cl. .................. 438/683; 438/630; 438/649; 438/651; 438/664; 438/682; 257/382; 257/384; 257/757; 257/768
(58) Field of Classification Search .............. 257/374, 257/384, 388, 412, 757, 768–770, E21.619, 257/E21.634, E29.156, 382, 377, 754; 438/630, 438/649, 655, 721, 651, 664, 682, 755
See application file for complete search history.

(56) References Cited

U.S. PATENT DOCUMENTS

| | | | |
|---|---|---|---|
| 5,908,309 A | 6/1999 | Andoh | 438/231 |
| 6,258,716 B1 * | 7/2001 | Ku | 438/654 |
| 6,271,122 B1 | 8/2001 | Wieczorek et al. | 438/627 |
| 6,869,866 B1 | 3/2005 | Chidambarrao et al. | 438/581 |
| 7,407,888 B2 * | 8/2008 | Ito et al. | 438/685 |
| 2001/0052648 A1 | 12/2001 | Sakurai et al. | 257/754 |
| 2003/0173589 A1 | 9/2003 | Ruf et al. | 257/200 |
| 2003/0211673 A1 | 11/2003 | Nakamura et al. | 438/197 |
| 2004/0092063 A1 | 5/2004 | Okumura et al. | 438/199 |
| 2004/0142567 A1 | 7/2004 | Nakajima et al. | 438/689 |

(Continued)

FOREIGN PATENT DOCUMENTS

DE 102 38 774 A1 4/2003

(Continued)

OTHER PUBLICATIONS

IBM Technical Disclosure Bulletin, "Applying Mechanical Stress to Improve MOS Semiconductor Performance," vol. 30, No. 9, Feb. 1988.

(Continued)

*Primary Examiner*—David Vu
*Assistant Examiner*—Suberr Chi
(74) *Attorney, Agent, or Firm*—Williams, Morgan & Amerson, P.C.

(57) ABSTRACT

By performing a silicidation process on the basis of a patterned dielectric layer, such as an interlayer dielectric material, the respective metal silicide portions may be provided in a highly localized manner at the respective contact regions, while the overall amount of metal silicide may be significantly reduced. In this way, a negative influence of the stress of metal silicide on the channel regions of field effect transistors may be significantly reduced, while nevertheless maintaining a low contact resistance.

13 Claims, 7 Drawing Sheets

U.S. PATENT DOCUMENTS

| | | | |
|---|---|---|---|
| 2004/0150111 A1 | 8/2004 | Shimazu et al. | 257/757 |
| 2005/0233514 A1 | 10/2005 | Bu et al. | 438/199 |
| 2006/0014393 A1* | 1/2006 | Lu et al. | 438/704 |
| 2006/0131662 A1* | 6/2006 | Yamada et al. | 257/374 |

FOREIGN PATENT DOCUMENTS

| | | |
|---|---|---|
| DE | 102 08 728 A1 | 10/2003 |
| DE | 10 2004 057 762 A1 | 6/2006 |

OTHER PUBLICATIONS

Written Opinion and International Search Report from PCT/US2007/019073 dated Feb. 21, 2008.

Translation of Official Communication from German Patent Office for German Patent Application No. 10 2006 040 764.4 dated May 6, 2009.

Translation of Official Communication from German Patent Office for German Patent Application No. 10 2006 040 764.4 dated Dec. 9, 2009.

* cited by examiner

TRANSISTOR HAVING A LOCALLY PROVIDED METAL SILICIDE REGION IN CONTACT AREAS AND A METHOD OF FORMING THE TRANSISTOR

BACKGROUND OF THE INVENTION

1. Field of the Invention

Generally, the present disclosure relates to the formation of integrated circuits, and, more particularly, to the formation of high performance transistors having a low contact resistance, possibly in combination with strain control mechanisms to adjust the strain in the channel region for enhancing charge carrier mobility in the channel region of a MOS transistor.

2. Description of the Related Art

Integrated circuits typically include a very large number of circuit elements, such as transistors, capacitors, resistors and the like, which are formed on the basis of an appropriate semiconductor material that is provided above a suitable substrate. In modern ultra-high density integrated circuits, device features are steadily decreasing to enhance device performance and functionality. Shrinking the feature sizes, however, entails certain problems that may partially offset the advantages obtained by the reduced feature sizes. Generally, reducing the feature sizes of, for example, a field effect transistor element, may lead to a decreased channel resistance for a given transistor width in the transistor element and thus result in a higher drive current capability and enhanced switching speed of the transistor. In decreasing the features sizes of these transistor elements, however, the increasing electrical resistance of conductive lines, such as the gate electrodes or other polysilicon lines and contact regions, i.e., of regions that connect transistor areas, such as drain and source regions, with the periphery of the transistor element becomes a dominant issue, since the cross-sectional area of these lines and regions also decreases with decreasing feature sizes. The cross-sectional area, however, determines, in combination with the characteristics of the material comprising the conductive lines and contact regions, the resistance thereof.

The above problems may be exemplified for a typical critical feature size in this respect, also referred to as a critical dimension (CD), such as the length of the channel of a field effect transistor that forms below a gate electrode between a source region and a drain region of the transistor. Reducing the channel length may significantly improve device performance with respect to fall and rise times when operating the transistor element in a switched mode due to the reduced capacitance between the gate electrode and the channel and due to the decreased resistance of the shorter channel. Shrinking the channel length, however, also entails the reduction in size of any conductive lines, such as the gate electrode of the field effect transistor, which is commonly formed of polysilicon, and the contact regions that allow electrical contact to the drain and source regions of the transistor. Consequently, the available cross-section for charge carrier transportation is reduced. The conductive lines and contact regions may therefore exhibit a higher resistance unless the reduced cross-section is compensated for by improving the electrical characteristics of the material forming the lines and contact regions, such as the gate electrode and the drain and source contact regions.

It is thus of particular importance to improve the characteristics of conductive regions that are substantially comprised of semiconductor material, such as silicon. For instance, in modern integrated circuits, the individual semiconductor devices, such as field effect transistors, capacitors and the like, are currently and will be in the foreseeable future primarily based on silicon, wherein the individual devices are connected by silicon lines and metal lines. While the resistivity of the metal lines may be improved using highly conductive metals, such as, copper, tungsten, silver, metal alloys and the like, process engineers are confronted with a challenging task when an improvement in the electrical characteristics of silicon-containing semiconductor lines and semiconductor contact regions is required. Thus, a highly conductive metal silicide is typically formed in polysilicon lines, such as gate electrodes and the drain and source regions, since the metal silicide typically exhibits a significantly higher conductivity compared to polysilicon and crystalline silicon even when highly doped. In conventional techniques, a plurality of highly sophisticated silicidation schemes are employed in order to provide the desired electrical characteristics. For example, refractory metals, such as nickel, platinum, cobalt, titanium, tungsten and the like, or combinations thereof, may be used for increasing the conductivity of polysilicon lines and contact regions. Irrespective of the specific silicidation regime used, the process is typically performed after completing the transistor devices and prior to forming the interlayer dielectric material, i.e., after performing any high temperature anneal processes for activating dopants in the drain and source regions and reducing implantation-induced lattice damage, since the conductive metal silicide materials are typically unstable at elevated temperatures as required for the dopant activation. Thereafter, respective contact plugs are formed in the interlayer dielectric material to provide electrical contact to the respective circuit regions, such as drain and source regions, gate electrodes, capacitor electrodes and the like, wherein the resulting contact resistance may be moderately low due to the provision of the metal silicide.

Generally, a plurality of process technologies are currently practiced, wherein, for complex circuitry, such as microprocessors, storage chips and the like, CMOS technology is currently one of the most promising approaches due to the superior characteristics in view of operating speed and/or power consumption and/or cost efficiency. During the fabrication of complex integrated circuits using CMOS technology, millions of transistors, i.e., N-channel transistors and P-channel transistors, are formed on a substrate including a crystalline semiconductor layer. A field effect transistor, irrespective of whether an N-channel transistor or a P-channel transistor is considered, comprises so-called PN junctions that are formed by an interface of highly doped drain and source regions with an inversely doped channel region disposed between the drain region and the source region.

The conductivity of the channel region, i.e., the drive current capability of the conductive channel, is controlled by a gate electrode formed near the channel region and separated therefrom by a thin insulating layer. The conductivity of the channel region, upon formation of a conductive channel due to the application of an appropriate control voltage to the gate electrode, depends on the dopant concentration, the mobility of the majority charge carriers, and, for a given extension of the channel region in the transistor width direction, on the distance between the source and drain regions, which is also referred to as channel length.

Thus, one efficient mechanism for increasing the transistor performance includes increasing the charge carrier mobility by modifying the lattice structure in the channel region, for instance by creating tensile or compressive stress in the vicinity of the channel region to produce a corresponding strain in the channel region, which results in a modified mobility for electrons and holes, respectively. For example, compressive strain in the channel region for a standard silicon layer may increase the mobility of holes, thereby providing the potential for enhancing the performance of P-type transistors. On the other hand, the creation of tensile strain in the channel region of an N-channel transistor may increase electron mobility. Consequently, a plurality of strain-inducing mechanisms may be used, such as strained or relaxed semiconductor material within a silicon base material in order to provide a desired type and magnitude of strain in the channel region. In other cases, stressed material layers, such as overlying dielectric materials, spacer elements and the like, may be provided, possibly in combination with strained or relaxed semiconductor materials, to obtain an even increased strain effect in the channel region. Other strain-inducing sources may also contribute to the finally achieved transistor performance, such as stressed isolation structures and the like. Also, the metal silicide regions, formed on gate electrodes and drain and source regions, may have a significant influence on the total strain created in the respective channel region. For example, typically used metal silicide materials, such as cobalt silicide and nickel silicide, exhibit a substantial tensile stress, which may negatively affect the strain-inducing mechanism provided by, for instance, an embedded silicon/germanium material, compressively stressed liners and the like. Consequently, the overall performance gain of the transistor that is expected due to the employment of sophisticated strain sources may be reduced.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the subject matter disclosed herein is directed to a technique for forming semiconductor devices including silicon-containing regions, the conductivity of which is to be at least partially increased by providing a metal silicide, wherein an enhanced degree of flexibility is provided in that the metal silicide may be formed in a spatially localized manner in order to take into consideration other device requirements, such as strain-inducing mechanisms, which may be affected by the amount of metal silicide provided in the respective device regions. For this purpose, the metal silicide of contact regions of circuit elements may be formed on the basis of a "mask" such that the respective metal silicide is "self-aligned" to respective contact elements, such as contact plugs, which are to be formed in a dielectric layer for connecting contact regions of circuit elements with a wiring structure. Thus, in some illustrative embodiments, a respective silicidation process may be performed on the basis of openings in a dielectric layer, in which the respective contact elements may be subsequently formed. Due to the highly localized provision of the metal silicide, which is automatically aligned with the respective contact elements, the total amount of metal silicide in a circuit element may be adjusted in accordance with other device requirements, such as strain-inducing mechanisms, while nevertheless maintaining a low contact resistance between the respective contact region of the circuit element and the contact element connecting to the wiring structure.

According to one illustrative embodiment disclosed herein, a method comprises forming a contact opening in an interlayer dielectric material covering a circuit element of a semiconductor device, wherein the contact opening connects to a silicon-containing contact region of the circuit element. Furthermore, a metal silicide is formed in a portion of the contact region, wherein the metal silicide extends into the portion of the contact region. Finally, a contact element is formed in the contact opening, wherein the contact element connects to the metal silicide.

According to another illustrative embodiment disclosed herein, a method comprises forming a refractory metal on a portion of a silicon-containing contact region of a circuit element, wherein the portion is exposed by an opening formed in a dielectric layer. Furthermore, a chemical reaction is initiated between the refractory metal and silicon in the portion in order to form a metal silicide.

According to yet another illustrative embodiment disclosed herein, a semiconductor device comprises a circuit element embedded in a dielectric material and having at least one silicon-containing region comprising an accumulated metal silicide portion. Furthermore, the semiconductor device comprises a contact element formed in the dielectric material and is aligned to a contact region of the at least one silicon-containing region, wherein the accumulated metal silicide portion is centered around the contact region.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

As previously explained, in sophisticated semiconductor devices such as complex CPUs, ASICs (application specific ICs), storage chips and the like, the ongoing scaling of device dimensions provides increased functionality and performance. However, the requirement for high packing density, i.e., reduced device dimensions, and high conductivity of respective device areas, such as contact regions of semiconductor devices, may not be adequately addressed by conventional techniques. For this purpose, the subject matter disclosed herein provides a technique for increasing design flexibility for forming metal silicide areas in respective contact regions of semiconductor devices, wherein, on the one hand, a low contact resistance may be obtained, while, on the other hand, a negative influence of the metal silicide on other performance-increasing mechanisms of the semiconductor device may be reduced. A corresponding "reduction" of any adverse influence of the metal silicide may be accomplished by appropriately adjusting the total amount of metal silicide that is formed in a respective contact region of a semiconductor device such that a high amount of metal silicide may be provided at specified locations within the respective contact region where a low contact resistance is required, while in other areas of the contact region a significantly reduced amount of metal silicide may be provided wherein, in some illustrative embodiments, substantially no metal silicide at all may be provided at specified areas of the contact region. Thus, a highly localized provision or "accumulation" of metal silicide in specified device areas may be achieved by initiating a respective metal silicide formation on the basis of a respective "silicidation mask" which exposes desired portions of the respective contact region, around which a respective accumulated metal silicide portion is to be formed. In some illustrative embodiments, the respective metal silicide portions are to be substantially centered around contact plugs or contact elements connecting a semiconductor device with an overlying metallization structure, wherein the accumulated or locally increased amount of metal silicide provides the desired low contact resistance, while the respective metal silicide amount in other areas may be significantly reduced or may be substantially zero compared to conventional strategies. In this way, the amount of metal silicide may be reduced in accordance with other device requirements, such as strain-inducing mechanisms, in order to obtain an overall performance gain.

For instance, cobalt silicide and nickel silicide are frequently used materials for reducing the contact resistance of semiconductor devices, such as field effect transistors and the like, wherein these materials are typically formed on surface portions of respective contact regions, such as drain and source regions, gate electrodes and the like. However, these metal silicides may have a relatively high amount of inherent tensile stress, which may be transferred into the respective channel region of the field effect transistor, thereby possibly degrading the performance thereof, especially when additional strain-inducing mechanisms are provided for generating a different type of strain as is induced by the tensile stressed metal silicide. For instance, a tensile stress in respective drain and source regions of a P-type transistor may, for a given standard crystallographic configuration of the base silicon material, result in a reduced hole mobility in the respective channel region, thereby significantly reducing the current drive capability of the transistor. In advanced techniques, respective strain-inducing mechanisms, such as stressed overlayers, strained semiconductor materials and the like, may be provided which may require high effort, such as additional epitaxial growth techniques and the like, during the manufacturing sequence. Consequently, a reduction in efficiency of these strain-inducing mechanisms may result in a reduced efficiency while nevertheless increased production costs are generated. Hence, the subject matter disclosed herein may be highly efficiently incorporated in respective strain engineering techniques to increase the strain-inducing efficiency of respective techniques, wherein, in some illustrative embodiments, a high degree of flexibility may be accomplished since the technique for locally providing metal silicide in respective contact regions may itself be applied in a spatially localized manner in order to provide the reduced total metal silicide amount in specified chip areas or even in different types of transistors, such as P-channel transistors and N-channel transistors.

It should therefore be appreciated that the principles of the subject matter disclosed herein may be advantageously applied to transistor elements including additional strain-inducing sources, such as strained or relaxed semiconductor materials positioned at appropriate device regions, stressed overlayers for spacer elements and the like, since, as pointed out above, the overall strain-inducing efficiency may be increased. The subject matter disclosed herein may, however, also be applied to circuit elements which may not include any "intentionally" provided strain-inducing sources, since even the reduction of the respective strain induced by the metal silicide itself may result in a corresponding performance increase. Furthermore, the localized formation of metal silicide may provide increased design and process flexibility in forming respective semiconductor devices, since, for instance, different types of metal silicide materials may be formed in a highly localized manner, wherein the effect of one silicidation process on the other silicidation process may be significantly reduced by forming at least one portion of a metal silicide on the basis of a dielectric mask exposing respective device areas, at which accumulated metal silicide portions are to be formed.

Figure 1A:
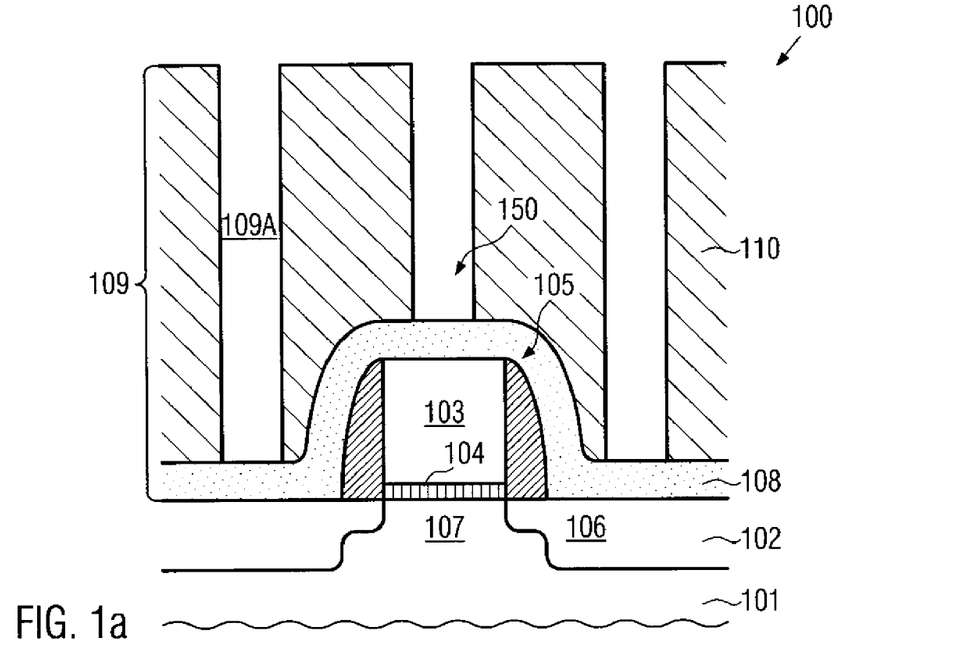
FIGS. 1a-1c schematically illustrate cross-sectional views of a semiconductor device during the formation of a localized metal silicide portion in a circuit element according to illustrative embodiments disclosed herein.

FIG. 1a schematically illustrates a cross-sectional view of a semiconductor device 100, which may comprise a semiconductor-based circuit element 150. The circuit element 150 may represent any circuit element including silicon-containing semiconductor regions, which may require, at least locally, a metal silicide material in order to reduce the respective contact resistance. In one illustrative embodiment, the circuit element 150 may represent a field effect transistor which may comprise, as illustrated, a gate electrode 103 formed on a respective gate insulation layer 104, which in turn separates the gate electrode 103 from a silicon-containing channel region 107. The channel region 107 may be located between respective drain and source regions 106, wherein the channel region 107 and the drain and source regions 106 may be formed in an appropriate semiconductor layer 102, which comprises a certain amount of silicon. For instance, the semiconductor layer 102 may represent a silicon-based material which may include additional components, such as germanium, carbon or any other atomic species for adjusting the desired characteristics of the semiconductor layer 102, for instance with respect to conductivity, strain, crystallographic orientation and the like. Furthermore, a respective dopant concentration and profile is established within the semiconductor layer 102 to define the drain and source regions 106 and the channel region 107. The semiconductor layer 102 may be formed above a substrate 101, which may comprise any appropriate carrier material for forming thereabove the semiconductor layer 102. In some illustrative embodiments, the substrate 101 may represent a bulk semiconductor substrate, such as a silicon substrate, wherein the semiconductor layer 102 may represent an upper portion thereof. In other illustrative embodiments, the substrate 101 may represent a carrier material having formed thereon an insulating layer, such as a silicon-on-insulator (SOI) configuration, or the substrate 101 may be comprised of an insulating material on which may be formed the semiconductor layer 102. In the manufacturing stage shown in FIG. 1a, the circuit element 150 may be embedded in a dielectric layer 109, which in the illustrative embodiment shown may be considered as an interlayer dielectric material as is typically used in advanced integrated circuits for passivating respective circuit elements and providing a substantially planar surface configuration for forming thereon an appropriate metallization structure for interconnecting respective circuit elements.

In some illustrative embodiments, the dielectric layer 109 may thus comprise two or more different materials, such as a first dielectric layer 110, which may itself comprise one or more different material layers, while one or more layers 108 may be provided, of which at least one may act as an appropriate etch stop layer for patterning the layer 110 so as to obtain respective openings 109A, as shown. For instance, the layer 110 may be comprised of silicon dioxide, while the at least one etch stop layer 108 may be comprised of silicon nitride, wherein, as previously explained, the layer 108 and/or the layer 110 may be provided with a high intrinsic stress when a respective strain in the channel region 107 is desired. For instance, if the circuit element 150 is to represent a P-channel transistor, the layer 108 may exhibit a high intrinsic compressive stress in order to provide a respective compressive strain in the channel region 107, wherein, for a standard crystallographic configuration of the silicon-based semiconductor layer 102, a respective uniaxial compressive strain component in the channel region 107 may provide increased hole mobility therein. Similarly, other strain-inducing sources, such as the sidewall spacer structure 105, may be provided in addition or alternatively to further strain-inducing sources, such as the etch stop layer 108.

The semiconductor device 100 as shown in FIG. 1a may be formed in accordance with the following processes. After providing the substrate 101 having formed thereabove the silicon-containing semiconductor layer 102, appropriate processes for defining respective active regions for circuit elements, such as the element 150, on the basis of appropriate isolation structures (not shown), in combination with forming a respective dopant profile in the respective regions, may be performed on the basis of well-established techniques. Thereafter, the gate electrode 103 and the gate insulation layer 104 may be formed on the basis of well-established process techniques, including advanced oxidation and/or deposition processes and respective patterning sequences to form the gate electrode 103 and the gate insulation layer 104 as shown. Next, the drain and source regions 106 may be defined on the basis of the sidewall spacer structure 105 by ion implantation or other processes for incorporating a desired dopant profile for defining the regions 106. It should be appreciated that further intermediate process steps may be performed to provide, for instance, a strained semiconductor material in the drain and source regions 106 and/or in or below the channel region 107, depending on the device requirements. For example, for a P-channel transistor, frequently an embedded strained silicon/germanium material may be incorporated in the drain and source regions 106 on the basis of well-established selective epitaxial growth techniques in order to provide a respective strain in the channel region 107.

After completing the drain and source regions 106, which may include respective anneal processes, a respective metal silicide may be formed, however with a reduced thickness, as will be described in more detail with reference to FIGS. 2a-2d. In other illustrative embodiments, as shown in FIG. 1a, the dielectric layer 109 may be formed, for instance, on the basis of plasma enhanced chemical vapor deposition (PECVD) for forming the at least one etch stop layer 108, wherein, as previously explained, a desired degree of intrinsic stress may be provided on the basis of appropriately adjusting the respective process parameters. Next, the layer 110 may be formed, for instance, on the basis of any appropriate technique, such as high density plasma chemical vapor deposition, sub-atmospheric chemical vapor deposition, plasma enhanced chemical vapor deposition and the like, depending on the device and process requirements. Next, the openings 109A may be formed on the basis of well-established lithography techniques wherein the etch stop layer 108 may be used for controlling the corresponding anisotropic etch process. The openings 109A may be used as a silicidation mask in the subsequent process sequence, in which respective locally increased or accumulated metal silicide portions are formed in respective contact regions aligned to the openings 109A. Thus, the position and the dimensions of the openings 109A may, in some illustrative embodiments, be selected so as to obtain respectively sized accumulated metal silicide portions that are spatially restricted to areas substantially corresponding to the respective openings 109A, except for a diffusion related size increase. In other illustrative embodiments, the opening 109A may concurrently represent respective openings for forming contact elements therein so that a corresponding number of accumulated metal silicide portions in the circuit element 150 corresponds to the respective contact elements or plugs still to be formed.

Figure 1B:
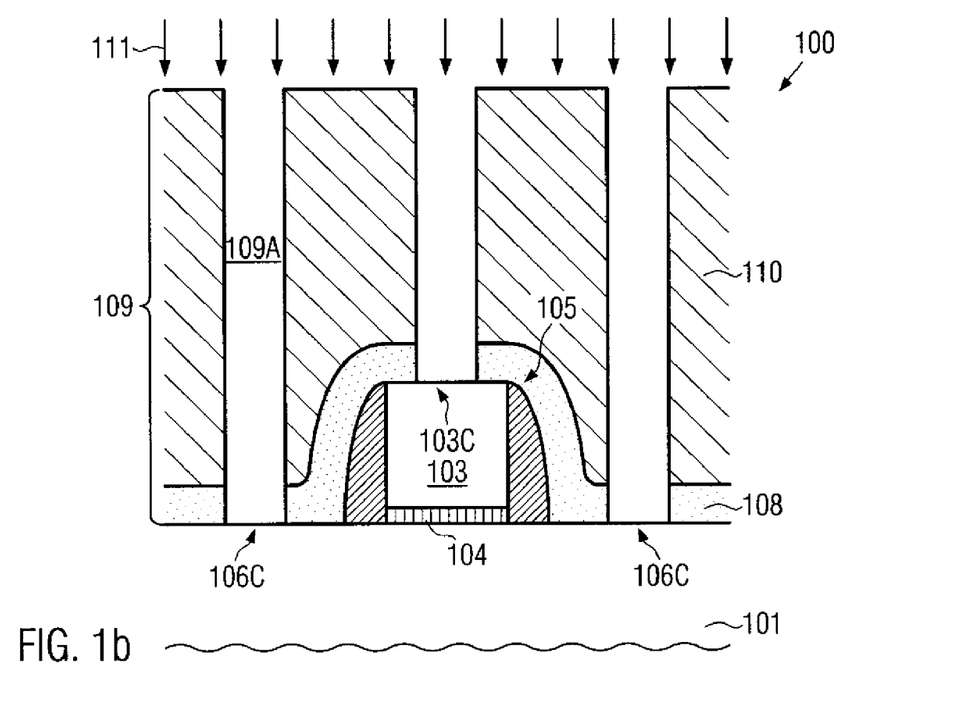

FIG. 1b schematically illustrates the semiconductor device 100 in a further advanced manufacturing stage. Here, the respective openings 109A are provided with increased depth so as to extend down to the respective silicon-containing semiconductor regions, i.e., in the illustrated embodiment, to the gate electrode 103 and the drain and source regions 106, thereby exposing respective contact regions 106C and 103C in the drain and source regions 106 and in the gate electrode 103, respectively. Furthermore, the semiconductor device 100 is subjected to a treatment 111 for preparing the exposed contact regions 106C, 103C for receiving a refractory metal thereon, wherein the treatment 111 may represent any appropriate cleaning process, such as a sputter etch process, a wet chemical process, a plasma etch process or any combination thereof. For instance, a refractory metal may be deposited on the exposed contact regions 106C, 103C on the basis of a sputter deposition process, wherein an initial phase of the deposition process may be used for appropriately removing contaminants that may have been created in the preceding process sequence for etching the etch stop layer 108. Next, an appropriate deposition process may be performed to provide an appropriate refractory metal on the basis of which a respective metal silicide may be formed in the contact regions 106C, 103C.

Figure 1C:
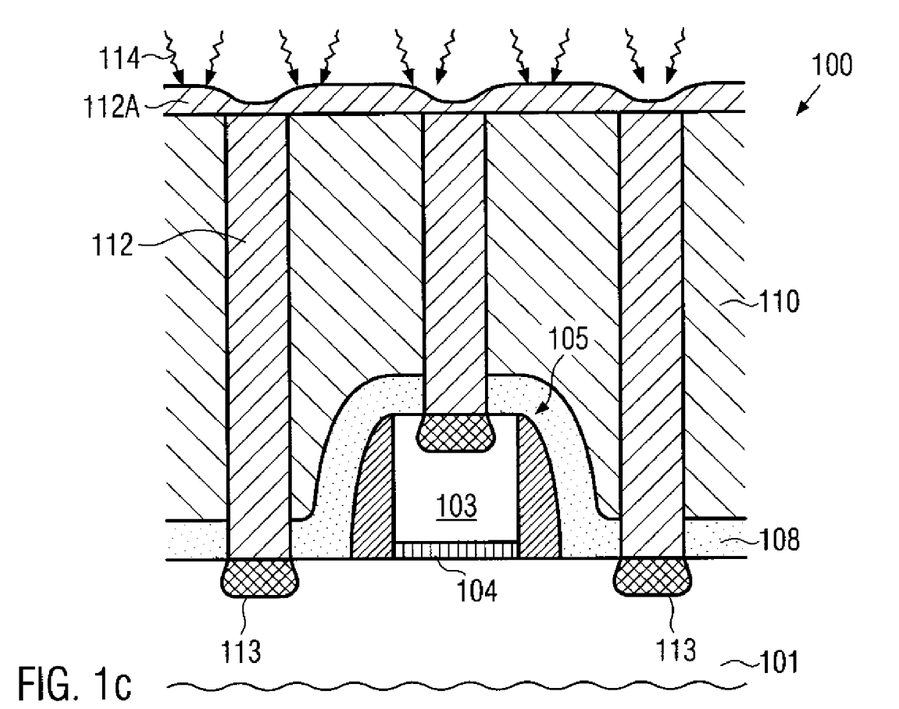

FIG. 1c schematically illustrates the semiconductor device 100 in a further advanced manufacturing stage. As shown, the respective openings 109A may be filled with an appropriate refractory metal 112, such as nickel, cobalt, titanium, tungsten, platinum and the like, or any combinations thereof. In the embodiment shown, the refractory metal 112 may be provided such that the respective openings 109A may be substantially completely filled, thereby also forming a respective layer 112A on the surface of the dielectric layer 109. In other illustrative embodiments, the material 112 may be provided so as to only partially fill the respective openings 109A wherein, however, at least a minimum amount of material 112 may be provided in each of the openings 109A in order to form appropriately sized metal silicide regions 113, which are substantially aligned with the respective openings 109A and may now define the respective contact regions 106C and 103C (FIG. 1b). The filling in of the refractory metal 112 into the respective openings 109A may be accomplished on the basis of any well-established techniques, such as sputter deposition, chemical vapor deposition (CVD) and the like, depending on the material characteristics and the availability of respective deposition procedures for the material 112 under consideration. For example, respective sputter deposition techniques for the refractory metals specified above are well established in the art and may be used for forming the material 112 within the openings 109A.

Thereafter, an anneal process 114 may be performed to initiate a chemical reaction of the refractory metal 112 and the silicon contained in the contact regions 106C, 103C. The anneal process 114 may be controlled on the basis of temperature and duration so as to determine the finally obtained size of respective metal silicide portions 113. That is, depending on the material characteristics, the conversion rate from silicon into the respective metal silicide may be determined for a specified process temperature so that the size of the portions 113 may then be controlled on the basis on duration of the process 114. For example, respective conversion rates for a plurality of process temperatures are well established for the above-specified refractory metals. In other cases, respective data may be readily obtained on the basis of test measurements and the like. Thus, during the anneal process 114, the accumulated, i.e., spatially localized, metal silicide regions 113 may be formed with an appropriate size so as to provide the desired contact characteristics while nevertheless restricting the total amount of the metal silicide within the drain and source regions 106 and the gate electrode 103 to a desired low fraction, depending on the device requirements.

After the anneal process 114, a non-reacted portion of the material 112 may be removed on the basis of a selective etch process, as are well established in the art for conventional silicidation schemes. After the removal of the excess material, the anneal process 114 may be continued, if required, in order to adjust the material characteristics of the metal silicide portions 113 in accordance with device requirements. For instance, the anneal sequence 114 may comprise any appropriate processes for thermally stabilizing the metal silicide 113 and/or the finally desired configuration of the metal silicide 113 may be adjusted, for instance by forming a disilicide and the like. It should be appreciated, however, that the process 114 may, in other illustrative embodiments, be configured as a single step anneal process for providing the desired metal silicide configuration and for adjusting the thermal stability thereof.

In other illustrative embodiments, the material 112 within the openings 109A may be maintained, while the layer 112A may be removed on the basis of any appropriate processes, such as chemical mechanical polishing (CMP) and the like, if the material is used as a conductive material for respective contact elements or plugs to be formed so as to connect the circuit element 150 with a wiring structure to be formed above the dielectric layer 109. In some illustrative embodiments, a barrier layer (not shown) may be provided at sidewalls of the openings 109A prior to the deposition of the refractory metal 112 in order to prevent undue interaction of the dielectric material of the layer 109 and the refractory metal 112, when used as a conductive material for a respective contact element. For this purpose, prior to the treatment 111 (FIG. 1b), an appropriate conductive barrier layer may be formed, for instance on the basis of sputter deposition, wherein a respective portion at the bottom of the openings 109A may be removed on the basis of the process 111, for instance by re-sputtering the material to expose the respective contact regions 106C, 103C. Thereafter, the refractory metal 112 may be deposited as described before and the further processing may be continued as described above. In this way, the stable and highly conductive silicide 113 may be provided in the respective silicon-containing regions 106 and 103, while the refractory metal 112 may concurrently provide the desired contact elements.

Figure 1D:
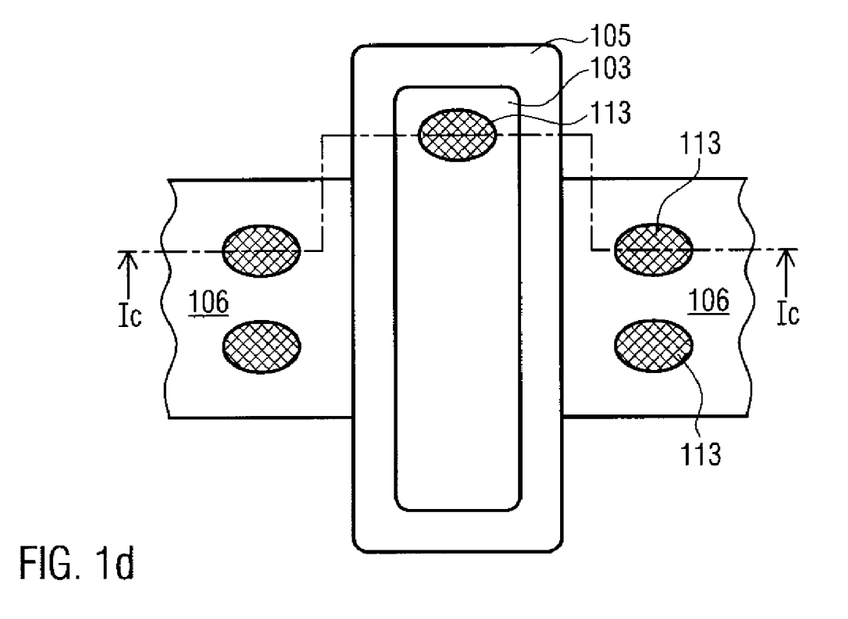
FIG. 1d schematically illustrates a top view of the device as shown in FIG. 1c.

FIG. 1d schematically illustrates a top view of the semiconductor device 100 according to the manufacturing stage as shown in FIG. 1c, wherein, for convenience, the dielectric layer 109 and the refractory metal 112, if still provided in the form of a contact element, are not shown. Thus, the respective accumulated metal silicide portions 113 may be provided in respective positions within the gate electrode 103 and the drain and source regions 106, determined by the "silicidation mask" in the form of the patterned dielectric layer 109. As is evident from FIG. 1d, increased amounts of metal silicide, such as portions 113, may be positioned so as to be aligned with respective contact elements, thereby providing a low contact resistance, whereas the total amount of metal silicide, which in a conventional strategy would be formed across the entire surface portion of the drain and source regions 106 and the gate electrode 103, may be significantly reduced, thereby also reducing the effect of the metal silicide on other device characteristics, such as a strain in the channel region 107.

Figure 1E:
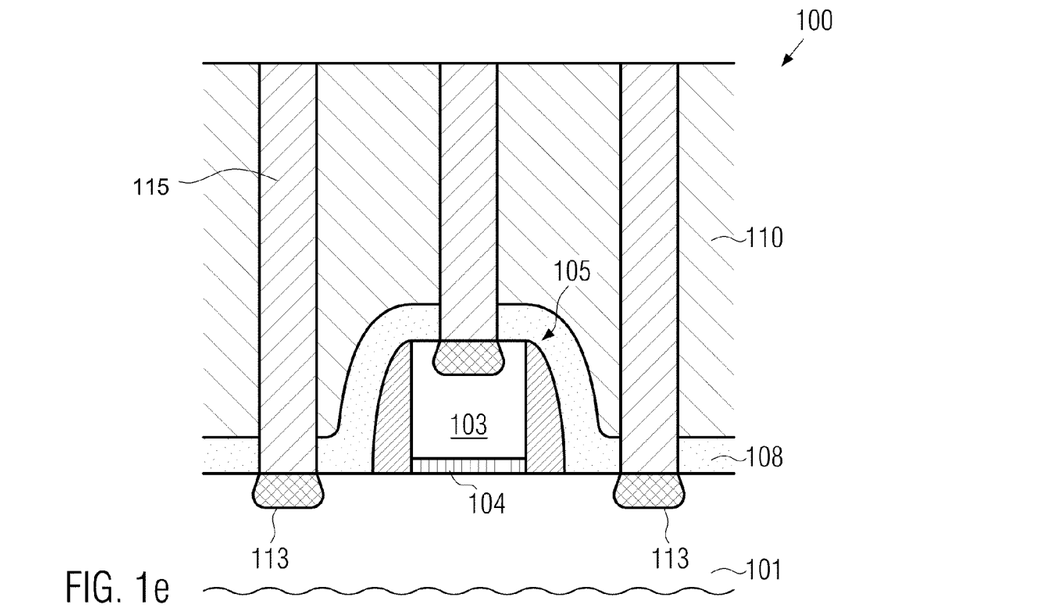
FIG. 1e schematically illustrates the semiconductor device in a cross-sectional view in a further advanced manufacturing stage, including contact plugs aligned with respective accumulated metal silicide portions.

FIG. 1e schematically illustrates the semiconductor device 100 in a further advanced manufacturing stage according to an illustrative embodiment in which the refractory metal 112 has been removed and is replaced by a different type of conductive material in order to form respective contact elements 115 or contact plugs, as required. For this purpose, any well-established process techniques may be applied, which may include the formation of a conductive barrier layer (not shown), if required, with a subsequent deposition of any appropriate conductive material, such as tungsten, copper, copper alloys, aluminum and the like. Thereafter, the further processing may be continued by forming one or more metallization layers for connecting to the respective contact elements 115.

Consequently, the circuit element 150 provides a low contact resistance by means of the localized metal silicide portions 113, wherein even the contact resistance may be lowered compared to conventional strategies, in that the respective metal silicide portions 113 may extend deeper into the silicon-containing regions 106, 103, compared to a conventional design, since the risk for shorting the respective PN junctions in the regions 106 may be significantly reduced due to highly localized positioning of the respective metal silicide portions compared to a substantially continuous metal silicide layer as is provided in the conventional devices.

Figure 2A:
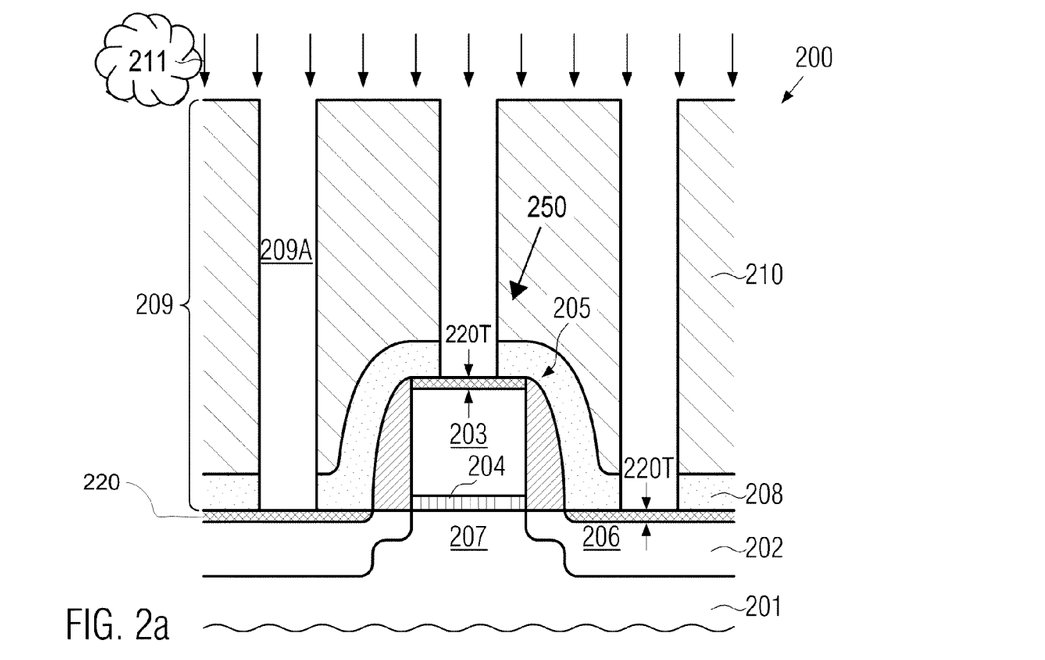
FIGS. 2a-2c schematically illustrate cross-sectional views of a semiconductor device during the formation of accumulated metal silicide portions in combination with a substantially continuous metal silicide layer of reduced thickness according to further illustrative embodiments disclosed herein.
Figure 2B:
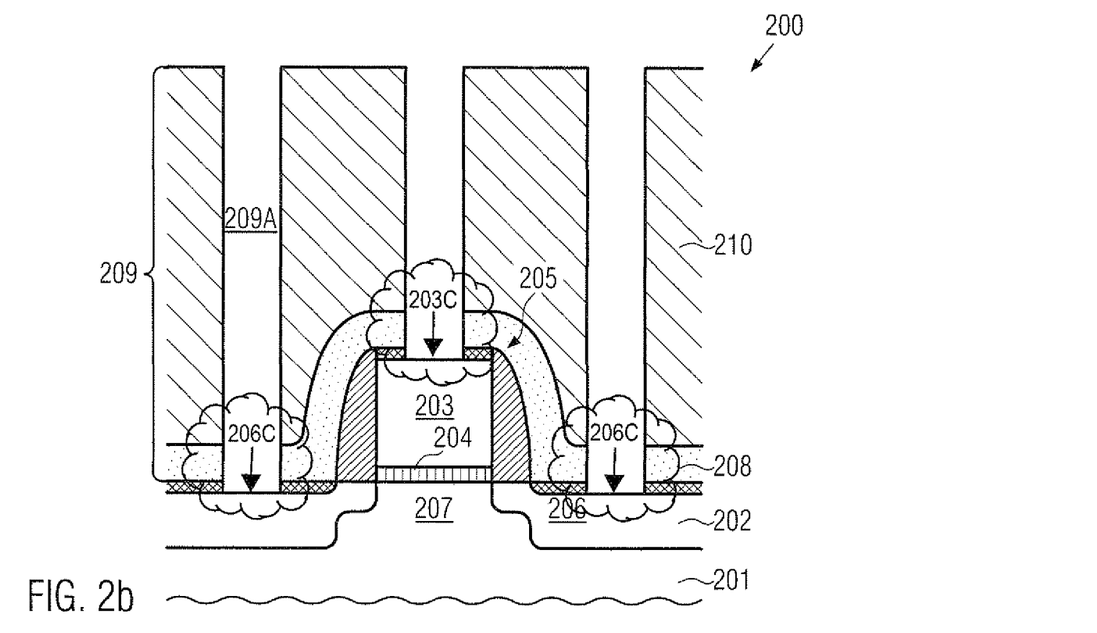
Figure 2C:
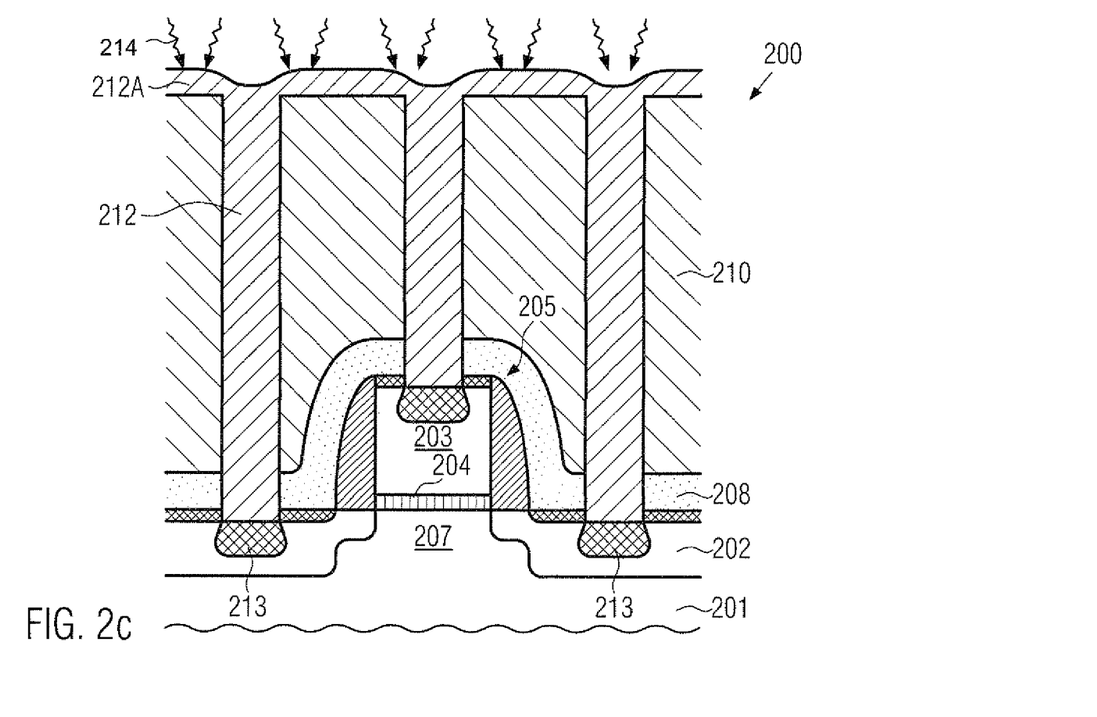

With reference to FIGS. 2a-2c, further illustrative embodiments will now be described, in which a substantially continuous layer of metal silicide may be formed prior to forming respective localized accumulated metal silicide portions as described above. The substantially continuous metal silicide may, however, contrary to conventional designs, be provided with a significantly reduced thickness in order to adjust the total amount of metal silicide in accordance with device requirements, as specified above.

FIG. 2a schematically illustrates a semiconductor device 200 including a circuit element 250, which may have substantially the same configuration as previously explained with respect to the semiconductor device 100 and the circuit element 150. Consequently, respective components of the circuit element 250 are denoted by the same reference signs, except for the first digit being a "2" instead of a "1." Hence, for convenience, these components will not be described in detail.

Contrary to the device 100, the device 200 may comprise, in this manufacturing stage, a laterally substantially continuous metal silicide layer 220, which may be formed in an upper portion of the respective silicon-containing regions 206 and 203, which may represent respective drain and source regions and a gate electrode, as is previously discussed with reference to the device 100. A laterally substantially continuous metal silicide layer is to be understood as a metal silicide layer that at least extends in the device width direction, i.e., the direction perpendicular to the drawing plane of FIG. 2a, across the entire region 206, as is the case in conventional advanced semiconductor devices including respective metal silicide regions in drain and source regions and gate electrodes of field effect transistors. However, a thickness of the metal silicide layer 220, indicated as 220T, may be selected significantly reduced compared to conventional strategies, wherein the metal silicide layer 220 may represent a base metal silicide for defining a specified base conductivity. Since the actual contact resistance may be defined later by providing respective accumulated or localized metal silicide portions, as explained above, the total amount of metal silicide in the layer 220 may be significantly reduced compared to conventional designs, thereby also reducing the resulting influence on other device characteristics, such as a strain in the channel region 207 and the like. For example, in advanced applications, the reduced thickness 220T of the base metal silicide 220 may range from approximately 1-10 nm for transistor elements having a gate length, i.e., in FIG. 2a the horizontal extension of the gate electrode 203, of approximately 50 nm and less. Moreover, in this manufacturing stage, the device 200 may comprise the dielectric layer 209 having formed therein the respective openings 209A which, as previously explained, may represent respective contact openings or may determine respective portions within the silicon-containing regions 206 and 203 at which respective contact regions are to be formed by providing an increased amount of metal silicide therein.

With respect to a manufacturing sequence for forming the device 200 as shown in FIG. 2a, substantially the same processes may be used as previously explained with reference to the device 100. However, contrary to the device 100, the base metal silicide layer 220 may be formed prior to forming the dielectric layer 209 on the basis of appropriately adjusted silicidation techniques so as to form the material 220 with the desired thickness 220T. For this purpose, after providing the drain and source regions 206, which may include respective strain-inducing sources, if required, a refractory metal, such as cobalt, nickel, platinum, titanium and combinations thereof, may be deposited and may be treated to initiate a chemical reaction with the underlying silicon-based material to form the layer 220. For this purpose, the temperature and/or the duration of a respective anneal process and/or a layer thickness of an initially deposited refractory metal may be appropriately controlled to obtain the desired target thickness 220T. The target for the thickness 220T may be selected on the basis of device requirements, such as a minimum required conductivity increase of surface portions of the regions 206 and 203 and the like. In some illustrative embodiments, the metal silicide of the layer 220 may have different characteristics compared to a metal silicide still to be formed on the basis of the openings 209A. That is, in some illustrative embodiments, the material characteristics of the layer 220 may be selected, in addition to providing a desired base conductivity, on the basis of characteristics, such as interface uniformity, thermal stability and the like. For instance, the layer 220 may be made of cobalt silicide, which may form a substantially well-defined interface with the remaining silicon-containing material of the regions 206 and 203, thereby minimizing the risk of shorting any PN junctions formed in the drain and source regions 206. In this case, the respective layer 220 may, if desired, be formed with a reduced offset to the channel region 207, substantially without jeopardizing the PN junction integrity. On the other hand, the respective accumulated metal silicide portions still to be formed in the respective contact regions defined by the openings 209A may be formed on the basis of a metal silicide providing an increased conductivity, such as nickel silicide, wherein the increased non-uniformity of the respective interface may be less critical.

Thus, after forming the metal silicide layer 220 having a desired composition and thickness, the dielectric layer 209 may be formed as is previously explained with reference to the device 100. Furthermore, in this manufacturing stage, the device 200 may be subjected to a treatment 211, which may be adapted to prepare an exposed surface portion of the respective contact regions 206C, 203C for receiving a refractory metal for a further generation of metal silicide. In one illustrative embodiment, the treatment 211 may be designed such that a substantial portion of the exposed metal silicide of the layer 220 may be removed, wherein, in one embodiment, the material removal may be performed such that the silicon-containing region 206 may be exposed. In this way, the influence of the previously formed metal silicide 220 during the subsequent process sequence for forming an additional metal silicide portion may be significantly reduced.

FIG. 2b schematically illustrates the semiconductor device 200 in a manufacturing stage in which the treatment 211 has been performed so as to substantially completely expose the contact regions 206C and 203C. Moreover, the treatment 211 may comprise any appropriate processes for preparing the exposed surface of the contact regions 206C, 203C for receiving a refractory metal that may be converted into an appropriate metal silicide, as is explained before.

FIG. 2c schematically illustrates the device 200 in a further advanced manufacturing stage, wherein the respective openings 209A are filled, at least partially, with an appropriate refractory metal 212, such as one of the methods specified above, wherein as previously explained, the refractory metal 212 may be different from the metal used for forming the metal silicide layer 220. For instance, the material 212 may comprise nickel, platinum and the like, which may provide a highly conductive metal silicide. Furthermore, in this manufacturing stage, the device 200 may be subjected to an anneal process 214 for initiating a chemical reaction between the refractory metal 212 and the silicon contained in the regions 203 and 206. In one illustrative embodiment, the anneal sequence 214 may be configured so as to additionally provide the required configuration of the metal silicide 220, while forming the respective portions 213. For instance, in some illustrative embodiments, the thermal stabilization or conversion of the metal silicide 220 may have not yet been performed and may be accomplished on the basis of the anneal process 214, in which the metal silicide 213 may also be formed. In other illustrative embodiments, the metal silicide 220 may be formed of a metal silicide having a high thermal stability with respect to a temperature used during the anneal process 214 for forming the portions 213. For instance, cobalt silicide may have a moderately high stability for temperatures up to 500-600° C. or even more, while nickel silicide may be efficiently formed at significantly lower temperatures, such as 200-500° C. Consequently, the metal silicide 213 may be formed in a highly localized fashion while still desired characteristics of the metal silicide layer 220 may be maintained or obtained. With respect to the size of the accumulated metal silicide portions 213, which thus substantially define the respective contact regions in the silicon-containing regions 206 and 203, the same criteria apply as previously explained with reference to the portions 113. Moreover, as previously explained, if the refractory metal 212 is considered appropriate for also acting as a conductive material for respective contact elements, excess material may be removed from surface portions of the dielectric layer 209 in order to form respective contact elements. In other embodiments, as previously discussed, the material 212 may be selectively removed with respect to the dielectric material of the layer 209 and with respect to the metal silicide materials 220 and 213 on the basis of well-established processes. Thereafter, if required, a further step of the anneal sequence 214 may be performed as previously explained. Then, the further processing may be continued as is previously explained, for instance by filling in an appropriate conductive material in the respective openings 209A to provide the respective contact elements or plugs for electrically connecting the regions 206, 203 with any metallization structures still to be formed.

As a consequence, the embodiments described above with reference to the device 200 provide an enhanced technique, wherein a high degree of conductivity of respective silicon-containing regions may be accomplished, while nevertheless a highly conductive metal silicide may be provided in a localized fashion, thereby maintaining the respective contact resistance at a low level, while nevertheless significantly reducing the total amount of metal silicide. Hence, the strain caused by metal silicide in the circuit element 250 may be significantly reduced in order to increase device performance, as explained above.

With reference to FIGS. 3a-3d and 4a-4e, further illustrative embodiments will now be described, in which the reduction of metal silicide may be accomplished for different circuit elements in a highly selective manner. That is, circuit elements requiring a significant reduction of metal silicide may be formed along with circuit elements requiring a moderately high amount of metal silicide.

Figure 3A:
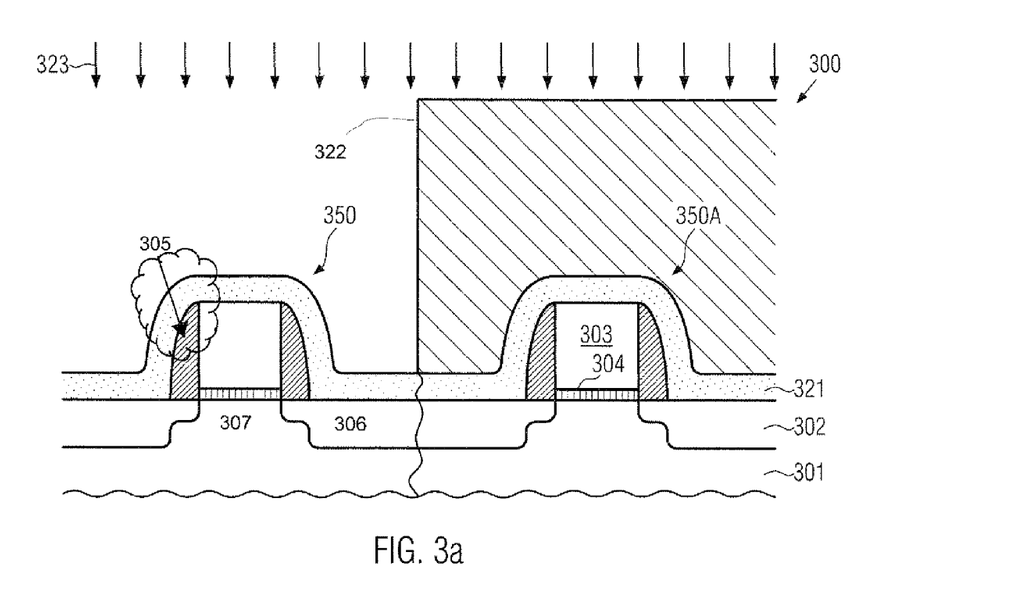
FIGS. 3a-3d schematically illustrate cross-sectional views of a semiconductor device during various manufacturing stages in forming respective base metal silicide layers of different thickness prior to selectively forming metal silicide portions aligned with respective contact elements according to still further illustrative embodiments.

FIG. 3a schematically illustrates a semiconductor device 300 comprising a first circuit element 350 and a second circuit element 350A, wherein the first circuit element 350 is to receive a reduced amount of metal silicide compared to the second circuit element 350A. The respective circuit elements 350, 350A may be formed above an appropriate substrate 301 having formed thereabove an appropriate semiconductor layer 302, which may comprise a certain amount of silicon. With respect to the substrate 301 and the semiconductor layer 302, the same criteria apply as previously explained with reference to the device 100 and 200. Furthermore, the circuit elements 350, 350A may comprise respective components as previously described with respect to the circuit elements 150 and 250 and, hence, for convenience, respective components may not be described in detail. It should be appreciated, however, that the respective components, such as the respective drain and source regions 306 may differ in characteristics, such as the type of dopant species contained therein, size and the like, depending on device requirements. For instance, the circuit elements 350, 350A may represent different types of transistor elements, such as a P-channel transistor and an N-channel transistor, which may require a different adaptation of the total amount of metal silicide in order to enhance device performance thereof. In other cases, the circuit elements 350, 350A may represent different device areas in a chip region, such as a memory area, in which a stress reduction may provide increased reliability, while the circuit element 350A may represent less stress critical regions or wherein the respective increased stress created by the metal silicide may be advantageously used for increasing the device performance thereof. Thus, in one illustrative embodiment, the circuit elements 350, 350A may represent respective field effect transistors, wherein, in the channel region 307 of the transistor 350, a reduced influence on the strain behavior may be desirable compared to the channel region 307 of the transistor 350A. Furthermore, in this manufacturing stage, a layer 321 of refractory metal, such as cobalt, nickel, platinum, combinations thereof and the like, may be formed on the transistor elements 350, 350A. Furthermore, a mask 322, such as a resist mask and the like, may be formed to expose the transistor 350 while covering the transistor 350A.

A typical process flow for forming the semiconductor device 300 as shown in FIG. 3a may comprise substantially the same processes as previously described with reference to the devices 100 and 200. Thus, the respective components 303, 304, 306 and 305 may be formed on the basis of well-established techniques. Thereafter, the refractory metal 321 may be deposited on the basis of any appropriate technique, while the mask 322 may be formed on the basis of well-established lithography techniques. For instance, if the circuit elements 350, 350A represent transistors of different conductivity type, the mask 322 may be established on the basis of respective lithography photo masks as are also used for incorporating the appropriate dopant species into the respective drain and source regions 306. If another spatial configuration for providing a metal silicide with highly localized portions may be required, the mask 322 may be formed on the basis of appropriately designed photo masks or any other lithography techniques for covering the circuit element 350A. Thereafter, the device 300 may be subjected to a process 323 for adjusting the amount of metal silicide to be formed in the different circuit elements 350, 350A. In one illustrative embodiment, the treatment 323 may include an etch process for removing material from the exposed portion of the layer 321, thereby providing a reduced amount of refractory metal that is available for a subsequent chemical reaction. In other illustrative embodiments, the treatment 323 may include an additional deposition process for increasing the layer thickness above the circuit element 350, while the respective material in the region corresponding to the circuit element 350A may be deposited on the mask 322, which may then be removed along with the mask 322. In still other illustrative embodiments, the treatment 323 may include a selective alteration of optical characteristics during a laser-based or flash-based anneal process for a subsequent chemical reaction between the refractory metal 321 and the underlying silicon. For instance, a respective layer may be deposited above the exposed portion of the material 321, which may have reflective or absorbing characteristics, depending on whether an increased or reduced anneal temperature is to be generated within the circuit element 350 in a subsequent flash- or laser-based anneal process. It should be appreciated that in other illustrative embodiments a respective layer may be deposited above both circuit elements 350, 350A and may be subsequently selectively removed on the basis of the mask 322.

Figure 3B:
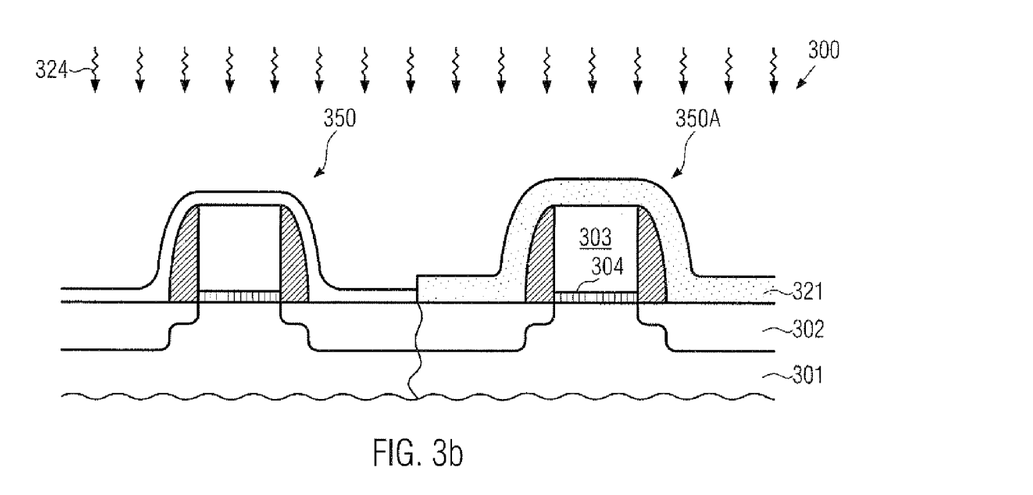

FIG. 3b schematically illustrates the device 300 in a further advanced manufacturing stage, wherein a portion of the refractory metal layer 321 is removed above the transistor 350 and wherein an appropriately designed anneal process 324 may be performed in order to convert the refractory metal in the layer 321 into a respective metal silicide, as previously explained. In the present example shown in FIG. 3b, the respective temperature and duration of the anneal process 324 may be selected such that substantially the entire amount of refractory metal in the device 350A may be consumed, while a respective silicidation process may result in a significantly reduced amount of metal silicide in the circuit element 350. As previously explained, in other illustrative embodiments, other control mechanisms may be applied to provide a different amount of metal silicide in the circuit elements 350, 350A.

Figure 3C:
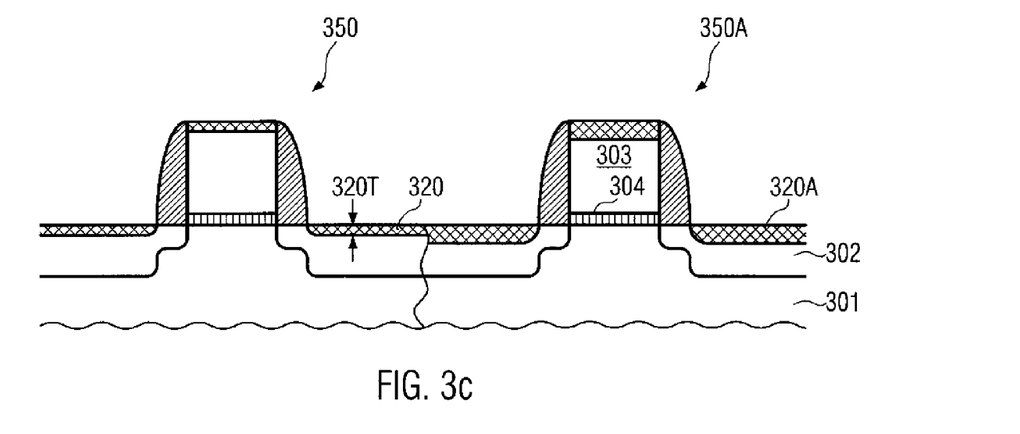

FIG. 3c schematically illustrates the semiconductor device 300 in a further advanced manufacturing stage, in which respective metal silicide regions 320 having a reduced thickness 320T are formed in the circuit element 350, as is also previously discussed with respect to the device 250, while a respective increased amount of metal silicide may be provided in the circuit element 350A, as indicated by 320A. For instance, if the circuit element 350A represents an N-channel transistor and the metal silicide 320A is provided as a cobalt silicide or nickel silicide having a tensile stress, the respective thickness of the layer 320A may be selected so as to obtain a high conductivity and a high tensile stress, while nevertheless insuring a high degree of integrity of the respective drain and source regions 306. On the other hand, the thickness 320T in the circuit element 350 may be selected on the basis of device requirements in view of a reduced influence of the respective metal silicide, wherein it should be appreciated that the thickness 320T may also be selected to be substantially zero, when considered appropriate. That is, in the sequence illustrated above, the respective exposed portion of the metal layer 321 may be substantially completely removed prior to the anneal process 324.

Thereafter, the further processing may be continued on the basis of the processes as described above with reference to the devices 100 and 200. That is, a respective dielectric layer may be formed and patterned so as to obtain appropriately positioned openings, such as openings for contact elements to be formed, wherein subsequently a corresponding second silicidation process may be performed, which may result in significantly increased metal silicide portions in the device 350, while the respective silicidation process may have a significantly reduced effect due to the different diffusion behavior in the respective silicon-containing regions. For example, during a respective process sequence, the respective silicon containing regions 306 may be exposed to the device 350, as is for instance shown in FIG. 2b, while in the circuit element 350A the increased thickness of the material 320A may prevent the exposure of the respective silicon-containing portion. Thus, upon initiating a respective silicidation process, the diffusion behavior may be different, thereby possibly resulting in an increased silicidation rate in the transistor 350.

Figure 3D:
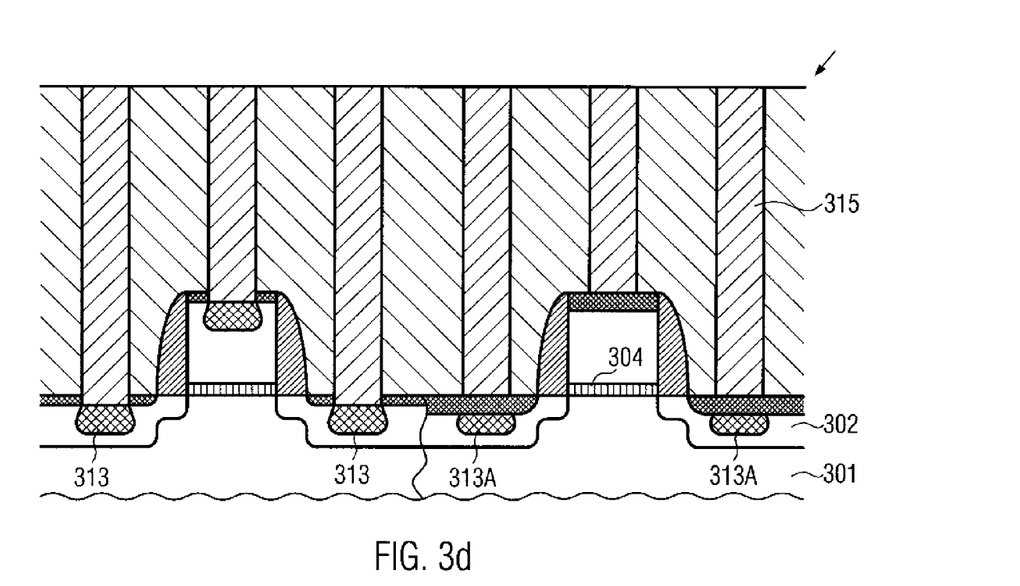

FIG. 3d schematically illustrates the semiconductor device 300 in a further advanced manufacturing stage, wherein respective accumulated or locally formed metal silicide portions 313 are provided in the circuit element 350, thereby obtaining a low contact resistance while reducing the total amount of metal silicide. In the circuit element 350A, respective portions 313A may also be formed, possibly with a significantly reduced dimension, due to the different start conditions during the silicidation process, thereby even further reducing the contact resistance, while also providing a high amount of metal silicide. Furthermore, respective contact elements 315 may be formed so as to be aligned to the portions 313, wherein the contact elements 315 may comprise the refractory metal used for forming the portions 313 or may comprise other materials, as is previously explained.

Figure 4A:
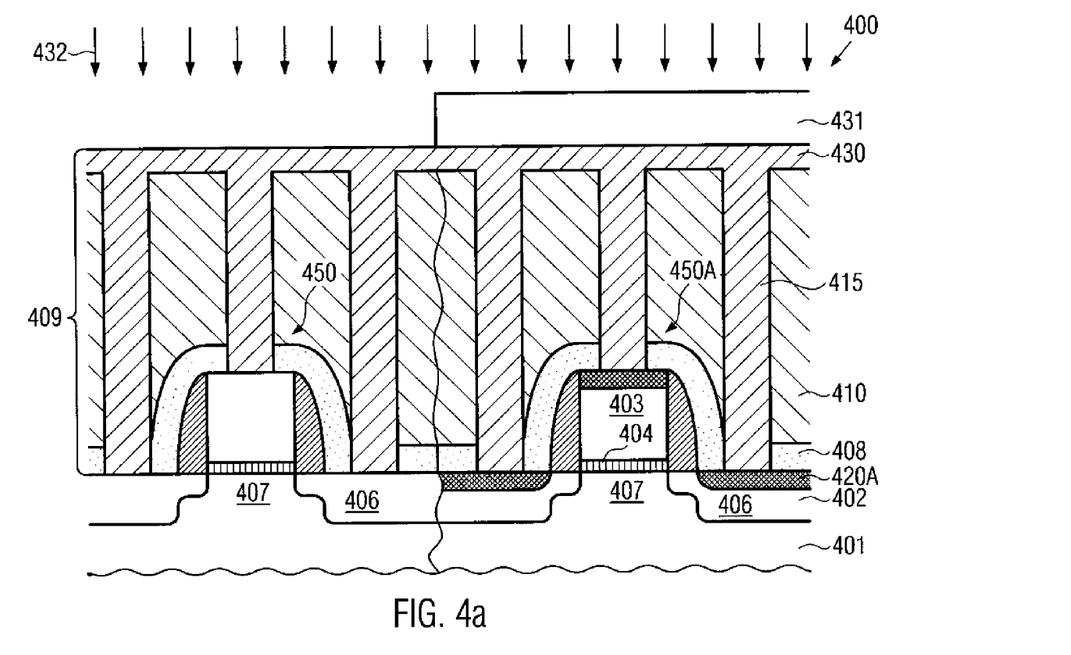
FIGS. 4a-4b schematically illustrate a semiconductor device during various manufacturing stages for selectively forming localized, i.e., accumulated, metal silicide portions according to yet other illustrative embodiments disclosed herein.

FIG. 4a schematically illustrates a cross-sectional view of a semiconductor device 400 including a first circuit element 450 and a second circuit element 450A. With respect to the components of the circuit elements 450, 450A, the same criteria apply as previously explained with reference to the device 300. Consequently, respective components are denoted with the same reference numbers, except for the first digit being a "4" instead of a "3," and the respective components will not be described. It should be appreciated that in FIG. 4a the device 450A may comprise the metal silicide 420A having an increased thickness according to device requirements, while the device 450 may have a metal silicide of significantly reduced thickness or may lack any metal silicide, depending on the device strategy. Furthermore, in this manufacturing stage, the device 400 may comprise the dielectric layer 409 including, for instance, an etch stop layer 408 and the dielectric material 410, wherein respective openings therein may be filled with a fill material, such as a polymer material and the like, having thermal characteristics that are appropriate for withstanding a subsequent anneal process for initiating a chemical reaction for forming a metal silicide in the circuit element 450. For instance, the fill material 430 may be provided as a curable polymer material, which may be heated to approximately 450° C. without losing mechanical integrity. Furthermore, an appropriate mask 431 may be formed to expose the device region above the circuit element 450, while covering the region above the circuit element 450A.

The semiconductor device 400 as shown in FIG. 4a may be formed on the basis of appropriate process techniques as previously explained with reference to the devices 100, 200 and 300. Then, after patterning the dielectric layer 409 on the basis of well-established techniques, the fill material 430 may be deposited on the basis of any appropriate deposition technique, such as spin-on methods, CVD and the like. Thereafter a planarization, if required, may be performed in some illustrative embodiments, while in other illustrative embodiments the deposition may provide sufficient surface planarity in order to form the mask 431 without a further planarization process. Next, a selective etch process 432 may be performed on the basis of the mask 431 in order to remove the fill material 430 from the first circuit element 450. Thereafter, the mask 431 may be removed and the further processing may be continued by depositing a refractory metal and initiating a chemical reaction in order to form respective accumulated metal silicide portions, as is previously explained with reference to the devices 100, 200 and 300. Hence, respective metal silicide portions will only be formed in the first circuit element 450, while the circuit element 450A is reliably covered by the fill material 430. In other illustrative embodiments, the fill material 430 may be removed from the circuit element 450A after the deposition of the corresponding refractory metal and prior to any anneal cycles performed to initiate the silicidation process. In this case, the fill material 430 may not have to be a material with high thermal stability and hence any appropriate material, such as photoresist and the like, may be used. In this case, the fill material 430 may be patterned without providing the mask 431.

Figure 4B:
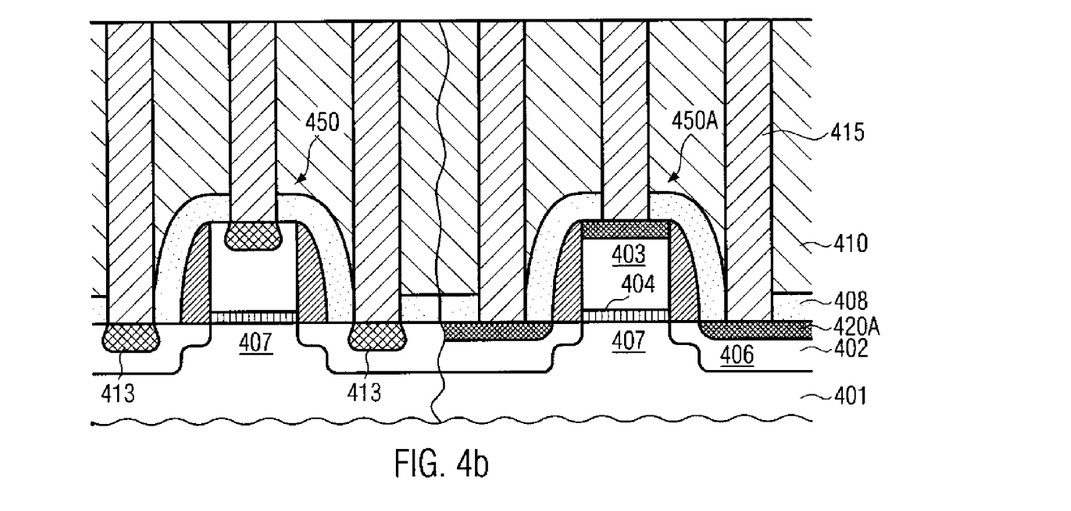

FIG. 4b schematically illustrates the semiconductor device 400 in a further advanced manufacturing stage. Here, respective localized metal silicide portions 413 are formed as respective contact regions in the drain and source regions and the gate electrode 406, 403 of the first circuit element 450, while the respective metal silicide regions 420A of the second circuit element 450A are substantially unaffected by the preceding silicidation process for forming the portions 413. Moreover, respective contact elements 415 are provided so as to connect to the respective metal silicide regions 403, 420A. Consequently, the device 400 may have a circuit element 450 having a reduced total amount of metal silicide, while still providing for a low contact resistance, wherein the device 450A may have a desired high amount of metal silicide 420A, wherein both manufacturing sequences for forming the metal silicides 413, 420A may be substantially decoupled from each other. That is, the silicidation process for forming the portions 413 may be formed on the basis of different materials, if required, compared to the silicidation process for forming the material 420A, thereby even further increasing the degree of flexibility for individually adapting the device characteristics at different areas of the semiconductor device 400. It should also be appreciated that the entire amount of metal silicide in the device 450A may be adjusted in any appropriate manner by additionally providing a base metal silicide, as is for instance described with reference to the devices 200 and 300.

As a result, the subject matter disclosed herein provides a technique for forming metal silicide in a highly localized manner in the form of accumulated metal silicide portions, which may be substantially aligned to respective contact elements with high precision, thereby providing the metal silicide in those silicon-containing areas in which a low contact resistance is required, while in other laterally adjacent areas a significantly reduced amount of metal silicide may be provided. In this way, the influence of the metal silicide on other device characteristics may be adjusted depending on device requirements. In illustrative embodiments, the adjustment of the entire amount of metal silicide in a respective silicon-containing semiconductor region may be based on strain characteristics of a respective channel region, wherein the amount of metal silicide may be reduced, at least in those circuit elements in which the corresponding stress of the metal silicide may negatively affect the overall strain characteristics of the respective channel region. Consequently, in this case the strain-inducing mechanisms typically used in sophisticated field effect transistors may be provided with increased efficiency, while nevertheless a low contact resistance may be maintained. Furthermore, when applying the silicidation regime in a selective manner, the metal silicide may be considered as an efficient additional strain-inducing source, which may be applied so as to enhance the overall transistor performance. For instance, tensile metal silicide may be provided with a significantly reduced amount in respective field effect transistors requiring a high degree of compressive strain in the respective channel region, while an increased metal silicide may be maintained in circuit elements, in which the tensile stress of the metal silicide may positively affect the performance characteristics thereof. Furthermore, an increased flexibility for the formation of metal silicide may be obtained, since different materials may be efficiently combined when two silicidation processes, i.e., a silicidation process prior to forming a dielectric cap layer and a silicidation process on the basis of the patterned dielectric layer are combined.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming a contact opening in a dielectric layer covering a circuit element of a semiconductor device, said contact opening connecting to a silicon-containing contact region of said circuit element;
    forming a contact element in said contact opening, wherein forming said contact element comprises completely filling said contact opening to a full depth with a refractory metal, a portion of said refractory metal covering said silicon-containing contact region;
    forming a metal silicide in said silicon-containing contact region, wherein forming said metal silicide comprises annealing said portion of said refractory metal covering said silicon-containing contact region, said contact element connecting to said metal silicide; and
    forming a base metal silicide in said silicon-containing contact region prior to forming said metal silicide, wherein a thickness of said base metal silicide is less than a thickness of said metal silicide.

2. The method of claim 1, wherein said base metal silicide is different in material composition compared to said metal silicide.

3. The method of claim 1, wherein said dielectric layer comprises a plurality of dielectric material layers, at least one of said plurality of dielectric material layers acting as an etch stop layer for patterning said dielectric layer to form said contact opening.

4. The method of claim 1, wherein said dielectric layer comprises a first dielectric material layer formed on said circuit element and a second dielectric material layer formed above said first dielectric material layer, a material composition of said first dielectric material layer differing from a composition of said second dielectric material layer.

5. The method of claim 4, wherein said first dielectric material layer is an etch stop layer.

6. The method of claim 4, wherein said first dielectric comprises a plurality of material layers, at least one of said plurality of material layers acting as an etch stop layer.

7. The method of claim 4, wherein said second dielectric layer comprises a plurality of material layers.

8. The method of claim 5, wherein forming said contact opening in said dielectric layer comprises patterning said second dielectric material layer on the basis of said etch stop layer.

9. A method, comprising:
  forming a contact element comprising a refractory metal on a portion of a silicon-containing contact region of a circuit element, said portion of said silicon-containing contact region being exposed by a contact opening formed in a dielectric layer and said refractory metal completely filling said contact opening to a full depth;
  initiating a chemical reaction between said refractory metal and silicon in said portion of said silicon-containing contact region to form a metal silicide, said contact element connecting to said metal silicide; and
  forming a first base metal silicide in said silicon-containing contact region prior to forming said contact opening, wherein a thickness of said first base metal silicide is less than a thickness of said metal silicide.

10. The method of claim 9, further comprising forming at least one strain-inducing source for a channel region of said circuit element.

11. A semiconductor device, comprising:
  a circuit element embedded in a dielectric material, said circuit element having at least one silicon-containing region comprising an accumulated metal silicide portion wherein said metal silicide is a silicide of a refractory metal, and said dielectric material comprising at least a first dielectric material layer formed above at least an uppermost surface of said circuit element and a second dielectric material layer formed thereabove, a composition of said first dielectric material layer differing from a composition of said second dielectric material layer;
  a contact element comprising said refractory metal formed in said dielectric material and being substantially aligned to a contact region of said at least one silicon-containing region, wherein said accumulated metal silicide portion is substantially centered around said contact region; and
  a layer of metal silicide formed substantially continuously in a surface area of said at least one silicon-containing region, said layer of metal silicide having a thickness less than said accumulated portion of metal silicide.

12. The semiconductor device of claim 11, wherein said at least one silicon-containing region is one of a drain region, a source region and a gate electrode of a first field effect transistor.

13. The semiconductor device of claim 12, further comprising at least one strain-inducing source creating a strain in a channel region of said first field effect transistor.

* * * * *